United States Patent [19]
Roland et al.

[11] Patent Number: 5,272,026
[45] Date of Patent: Dec. 21, 1993

[54] NEGATIVE IMAGE PROCESS UTILIZING PHOTOSENSITIVE COMPOSITIONS CONTAINING AROMATIC FUSED POLYCYCLIC SULFONIC ACID OR PARTIAL ESTER OF PHENOLIC RESIN WITH DIAZOQUINONE SULFONIC ACID OR DIAZOQUINONE CARBOXYLIC ACID, AND ASSOCIATED IMAGED ARTICLE

[75] Inventors: Bruno Roland, Heverlee; Jan Vandendriessche, Haasrode; Catherine Jakus, Diegem, all of Belgium

[73] Assignee: UCB S.A., Brussels, Belgium

[21] Appl. No.: 833,724

[22] Filed: Feb. 11, 1992

Related U.S. Application Data

[60] Division of Ser. No. 668,810, Mar. 8, 1991, Pat. No. 5,116,715, which is a continuation of Ser. No. 284,058, Dec. 12, 1988, abandoned.

[30] Foreign Application Priority Data

Dec. 18, 1987 [GB] United Kingdom ............... 8729510

[51] Int. Cl.$^5$ .......................... G03F 7/36; G03F 7/38
[52] U.S. Cl. ..................................... 430/18; 430/165; 430/291; 430/313; 430/315; 430/319; 430/325
[58] Field of Search ............... 430/165, 190, 191, 192, 430/193, 325, 313, 315, 18, 291, 319

[56] References Cited

U.S. PATENT DOCUMENTS

| | | | |
|---|---|---|---|
| 3,046,120 | 7/1962 | Schmidt et al. | 430/190 |
| 3,126,281 | 3/1964 | Sus et al. | 430/193 |
| 3,269,837 | 8/1966 | Sus | 430/193 |
| 3,745,011 | 7/1973 | Hudgin . | |
| 3,969,118 | 7/1976 | Stahlhofen et al. | 430/191 |
| 4,148,654 | 4/1979 | Oddi | 430/192 |
| 4,307,173 | 12/1981 | Gventer | 430/191 |
| 4,458,000 | 7/1984 | Stahlhofen | 430/191 |
| 4,777,111 | 10/1988 | Blumel et al. | 430/156 |
| 4,816,380 | 3/1989 | Covington et al. | 430/311 |
| 4,847,178 | 7/1989 | Komano | 430/191 |
| 4,929,534 | 5/1990 | Stephani et al. | 430/191 |
| 4,997,742 | 3/1991 | Covington et al. | 430/192 |

FOREIGN PATENT DOCUMENTS

| | | | |
|---|---|---|---|
| 0161660 | 11/1985 | European Pat. Off. | 430/156 |
| 0184567 | 6/1986 | European Pat. Off. | 430/192 |
| 1398641 | 6/1975 | United Kingdom . | |

OTHER PUBLICATIONS

Hiraoka et al., IBM Technical Disclosure Bulletin, vol. 20, No. 5 Oct., 1977.
Konishiroku Photo Ind. Co. Ltd., Patent Abstracts of Japan, vol. 11, No. 79, Mar. 11, 1987, p. 26P55 JP-A-61 235 832.
Toray K.K., Patent Abstracts of Japan, vol. 8, No. 282, Dec. 22, 1984, p. 123 P 323 JP-A-59 148 060.
Noller, Textbook of Organic Chemistry, 2nd Edition, W. B. Saunders Company, p. 573 and 584-587.
Endermann et al., Chemical Abstracts, vol. 83 (1975), p. 360 Abstract No. 211324k.
Levine, Chemical Abstracts, vol. 77 (1972), p. 430 Abstract No. 107738p.

*Primary Examiner*—Charles L. Bowers, Jr.
*Assistant Examiner*—Christopher G. Young
*Attorney, Agent, or Firm*—Wenderoth, Lind & Ponack

[57] ABSTRACT

A photosensitive composition having contrast and selectivity, useful in forming high resolution patterns.
The composition comprises a phenolic resin, a diazoquinone compound and an aromatic fused polycyclic sulfonic or carboxylic acid, in the form of the free acid and/or an ammonium salt and/or an acid halide, the cation component of the ammonium salt having the formula

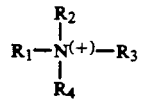

wherein $R_1$, $R_2$, $R_3$ and $R_4$, each represent hydrogen, $C_1$-$C_4$-alkyl or $C_1$-$C_4$-hydroxyalkyl.
In forming a negative pattern, the composition is coated on a substrate and exposed imagewise to ultraviolet radiation, thereafter treated with a silicon compound, whereby the silicon compound is selectively absorbed into the irradiated portions and the non-irradiated portions are then removed by dry etching.

15 Claims, No Drawings

NEGATIVE IMAGE PROCESS UTILIZING PHOTOSENSITIVE COMPOSITIONS CONTAINING AROMATIC FUSED POLYCYCLIC SULFONIC ACID OR PARTIAL ESTER OF PHENOLIC RESIN WITH DIAZOQUINONE SULFONIC ACID OR DIAZOQUINONE CARBOXYLIC ACID, AND ASSOCIATED IMAGED ARTICLE

This application is a division of application Ser. No. 668,810, filed Mar. 8, 1991, U.S. Pat. No. 5,116,715 which application is, in turn, a continuation of now abandoned application Ser. No. 284,058, filed Dec. 12, 1988.

The present invention relates to photosensitive compositions suitable or use as photoresists in the manufacture of very large scale integrated semiconductor circuits, as well as to a process of forming a pattern, wherein use is made of these compositions. More particularly, the present invention relates to photosensitive compositions containing phenolic resins and diazoquinone compounds that exhibit improved contrast and selectivity, by the addition thereto of a small amount of an aromatic fused polycyclic sulfonic or carboxylic acid and/or an ammonium salt thereof and/or an acid halide thereof. The process used in the commercial production of integrated circuits to obtain specific patterns is called "microlithography". In this process, the photosensitive composition (or photoresist) is first deposited on a substrate, e.g. a silicon wafer, then imagewise exposed to ultraviolet radiation and developed. After development, the remaining parts of the photoresist layer then act as a protective barrier during the subsequent processing steps such as etching, ion implantation, etc. Usually, development is carried out in a liquid, taking advantage of the radiation-induced change in solubility of the photoresist layer. However, a preferred method of development is dry etching using for instance an oxygen plasma, since this method avoids use of large amounts of developing solvents and allows the dimensional control desired in the creation of micrometer and submicrometer dimensional patterns. But, when dry etching is used to create the patterns, it is of the uttermost importance that a sufficient differentiation is realized between the exposed and unexposed parts of the photoresists. This can be done for example by making some areas of the organic material of the photoresist more resistant to the plasma etching. A very efficient method for obtaining a decrease in the etch rate consists in incorporating inorganic materials into the organic resist layer. During the development steps, the inorganic elements will be oxidized by the oxygen plasma to non-volatile oxides that will form a protective barrier towards the plasma. Incorporation of a sufficient amount of inorganic elements will result in a drastic reduction of the etch rate in the oxygen plasma.

Very recently, processes have been developed which permit the imagewise incorporation of inorganic elements such as silicon into the organic resist layer and which consequently enable dry etching using an oxygen plasma. An example of such a process is disclosed in European patent application 184 567. In this process, use is made of photosensitive compositions comprising a phenolic resin and a photosensitive diazoquinone compound. This photosensitive composition is successively deposited on a substrate, e.g. a silicon wafer, imagewise exposed to ultraviolet light having a wavelength of from 100 to 600 nm, treated with a silylating agent such as hexamethyldisilazane and dry developed using an oxygen plasma or oxygen-reactive ion etching technique. The exposure of the photosensitive composition to ultraviolet radiation produces increased permeability of the exposed parts, which enables the silylating agent to diffuse selectively into these exposed parts. Consequently, during the subsequent treatment of the photoresist with the silylating agent, the latter will selectively penetrate into these exposed parts, where it will then react with the free hydroxyl groups of the phenolic resin.

During the dry development step, the upper layer of the silylated parts of the resist surface is transformed in an anisotropic oxygen plasma into a refractory $SiO_2$ layer which protects underlying layers against further oxidation. As a result, only the exposed parts, containing silicon, will remain, thus producing a negative pattern. In this process, the silylation is carried out by treating the resist surface after UV exposure with a silylating agent which may be vaporized, liquefied or dissolved in a solvent. Suitable silylating agents are hexamethyldisilazane, heptamethyldisilazane, hexaphenyldisilazane, tetrachlorosilane, alkyl- and aryl-halosilanes, N-trimethylsilyldimethylamine, N-trimethylsilyldiethylamine, 1,3-bis(chloromethyl)-1,1,3,3-tetramethyldisilazane, N-trimethylsilylimidazole, N-trimethylsilylacetamide, hexamethylsilanediamine, N,O-bis(-triethylsilyl)acetimide, N,N'-bis(trimethylsilyl)urea, N,N'-diphenyl-N-(trimethylsilyl)urea and mixtures of at least two of these compounds.

This process has several important advantages. Since the incorporation of silicon can advantageously be limited to a relatively thin top part of the resist, it is not required for the exposing radiation to penetrate through the entire thickness of the resist layer. Thus exposure of a relatively thin top portion of the resist is sufficient. This is in contrast with wet developed resist systems where exposure through the entire thickness of the resist layer is essential for complete development.

Furthermore, it is well known that higher resolution can be obtained by the use of short wavelength radiation, such as ultraviolet radiation of wavelength below 320 nm. However, phenolic resins are highly absorbing in this portion of the ultraviolet region of the spectrum. In wet development processing techniques, this represents an important drawback if exposure is carried out at wavelengths less than 300 nm, such as deep UV exposure at 249 and 193 nm. In contradistinction thereto, in a process such as described in the above-mentioned European patent application, this constitutes an important advantage, since no light penetrates deep enough to be reflected from the substrate. On the other hand, when near UV (350-500 nm) is used for exposure, absorbance of the resin itself may not be sufficient to avoid light reflections from the substrate. In such a case, in the above-mentioned process of European patent application 184 567, the resist layer can easily be made very absorbant for light to avoid light reflections from the substrate, since imaging has to occur only in a relatively thin layer at the top part of the photoresist (contrary to wet developed resist systems). Light absorbance of the photosensitive composition can be increased for example by adding specific dyes, which absorb light at a wavelength of 350 to 450 nm.

In the manufacture of very large scale integrated circuits, it is of first importance that the photosensitive composition exhibits a high contrast and high selectivity because it leads to higher image quality and higher resolution capabilities.

A definition of the contrast can be found in the book of L. P. THOMPSON, C. G. WILLSON and M. J. BOWDEN, "Introduction to Microlithography", American Chemical Society Symposium Series 219, Amer.Chem.Soc., Washington D.C., 1983, Chapter 4, p.168-169. Contrast is determined experimentally by exposing a resist layer to varying exposure doses and measuring the residual film thickness after development. When one plots residual film thickness after development versus the logarithm of the UV exposure dose, there will be obtained a contrast curve. Until a certain treshold exposure dose $D_o$ no resist will remain after development; at exposure doses higher than $D_o$, the residual film thickness remaining after development will increase linearly with the logarithm of the exposure dose and will finally level off at a certain residual film thickness $t_r$. Contrast ($\delta$) is determined from the slope of the linear portion of this contrast curve and can be expressed in the form of the following equation:

$$\delta = 1/(\log D_m - \log D_o)$$

wherein $D_m$=is the exposure dose determined by extrapolating the linear portion of the contrast curve to the value corresponding to the residual film thickness $t_r$ remaining after development,
$D_o$=the threshold exposure dose as explained above.

It can be easily understood that the steeper the slope of the contrast curve, the higher the contrast will be. On the other hand, higher contrast will give much better profile with more vertical side-walls since the influence of light diffraction at the edges of the resist patterns will be considerably lower ($D_m$ being closer to $D_o$). The contrast of the conventional wet developed photosensitive compositions based on phenolic resins and diazoquinone is generally less than 2.5. Thus, the development of photosensitive compositions that have a high contrast is highly desirable.

Selectivity (s) is the ratio of the etch rate (or development rate) in the unexposed area to the etch rate in the exposed area and can be expressed by the following formula:

$$s = t_i/(t_i - t_r)$$

wherein
$t_i$=initial film thickness,
$t_r$=residual film thickness remaining after development of the exposed resist.

It is clear that the residual film thickness after development is directly related to the selectivity.

Selectivity values higher than 10 are considered as good. The contrast and the selectivity can not only affect the resolution capabilities and the profiles, but also the linewidth control. The higher the contrast and the selectivity, the less linewidth loss during development is to be expected. This is particularly important in a process such as described in the above-mentioned European patent application where development is carried out by dry etching in an oxygen plasma. Indeed, in this process the amount of silicon that is incorporated in the resist and consequently the degree of etch resistance will depend on the exposure dose (if all other factors are kept constant). Due to light diffraction, the exposure dose lies between $D_o$ and $D_m$ in the areas near the edges of the desired resist pattern. This means that in these areas the etch rate during plasma development will gradually decrease from a minimum above exposure dose $D_m$ to a maximum below exposure dose $D_o$, thus producing negative patterns with inclined sidewalls after development. As a result, at intermediate etch rates (between these maximum and minimum etch rates), there will also occur a decrease in linewidth with development time, for example when an overetch is applied. In short, it can be stated that the smaller the difference between maximum and minimum etch rates, i.e. the higher the contrast ($D_m$ being closer to $D_o$) and the higher the selectivity, the smaller the loss of linewidth will be (and the better the linewidth control).

Thus, there remains a need for photosensitive compositions that have as high a contrast value and as high a selectivity as possible. Accordingly, an object of the present invention is to provide photosensitive compositions that have a high contrast value and high selectivity and more particularly photosensitive compositions that have high contrast and selectivity when used in processes such as those described in European patent application 184 567, where high resolution is afforded by selective incorporation of a silicon compound into the irradiated portions of the photoresist and subsequent development by dry etching techniques.

It has now been found as a result of extensive researches that this object can be achieved by adding a small amount of an aromatic fused polycyclic sulfonic or carboxylic acid and/or an ammonium salt thereof and/or an acid halide thereof, to a photosensitive composition containing phenolic resins and diazoquinone compounds.

Indeed, we have, surprisingly, found that the addition of a small amount of an aromatic fused polycyclic sulfonic or carboxylic acid and/or an ammonium salt thereof and/or an acid halide thereof, to a photosensitive composition based on phenolic resins and diazoquinones, dramatically improves the contrast (up to a value as high as 11) as well as the selectivity of such a composition and more particularly when such a composition is used in a process such as described in the above-mentioned European patent application 184 567. Furthermore, in the latter case, i.e. when used in the process as described in this European patent application, we have found that a composition based on phenolic resins and diazoquinones, to which the above-mentioned acid and-/or derivative is added, enables, in addition to increased contrast and selectivity, a substantial decrease of the silylation temperature in comparison with a composition to which no such acid or its derivative is added. In this connection, it must be emphasized that in such a process, a decrease of the silylation temperature brings about a significant advantage since the risks of explosion due to decomposition of the silylating agent, can be decreased, decomposition which can already occur below 200° C. depending on the structure of the silylating agent and the silylating conditions.

Accordingly, the present invention provides an improved photosensitive composition which comprises at least one phenolic resin, at least one diazoquinone compound and at least one aromatic fused polycyclic sulfonic or carboxylic acid, in the form of the free acid and/or an ammonium salt and/or an acid halide, the cation component of the ammonium salt having the formula

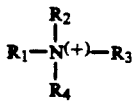

wherein $R_1$, $R_2$, $R_3$ and $R_4$, which may be the same or different, each represent a hydrogen atom, an alkyl or a hydroxyalkyl group containing 1 to 4 carbon atoms, with the proviso that said aromatic sulfonic or carboxylic acid is other than an aromatic amino acid.

The aromatic fused polycyclic sulfonic or carboxylic acids which are used in the photosensitive compositions according to the present invention as additives to increase contrast and selectivity, can be used in the form of the free acid and/or an ammonium salt and/or an acid halide thereof.

The aromatic fused polycyclic sulfonic or carboxylic acids are preferably naphthalene-sulfonic or -carboxylic acids or diazoquinonesulfonic or -carboxylic acids, which include for example:
1-naphthalenesulfonic acid,
2-naphthalenesulfonic acid,
3-diazo-3,4-dihydro-4-oxo-1-naphthalenesulfonic acid,
6-diazo-5,6-dihydro-5-oxo-1-naphthalenesulfonic acid,
6-diazo-5,6-dihydro-5-oxo-2-naphthalenesulfonic acid,
4-diazo-3,4-dihydro-3-oxo-1-naphthalenesulfonic acid,
5-diazo-5,6-dihydro-6-oxo-1-naphthalenesulfonic acid,
5-diazo-5,6-dihydro-6-oxo-2-naphthalenesulfonic acid,
the corresponding carboxylic acids and mixtures of at least two of the aforesaid compounds.

Particularly preferred aromatic fused polycyclic sulfonic acids which can be used in the photosensitive compositions according to the present invention are the diazoquinone-sulfonic acids represented by the following formula

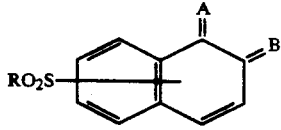

wherein A represents $N_2$ or O and B is O when A is $N_2$ or B is $N_2$ when A is O and R represents OH, Hal or OM, where Hal is a halogen atom and M is an ammonium or a substituted ammonium ion.

It is well known that the above-mentioned diazoquinone-sulfonic or -carboxylic acids, in the form of the free acid, are in equilibrium with the corresponding internal diazonium salts. This equilibrium is dependent on the pH and also on the concentration, since one acid molecule can serve as the counterion for the diazonium salt of another acid molecule.

The use of the diazoquinone-sulfonic or -carboxylic acids in the form of these diazonium salts is also included within the scope of the present invention.

When the aforesaid aromatic fused polycyclic sulfonic or carboxylic acids are in the form of an ammonium salt, the cation component of the ammonium salt is preferably selected from those having the formula

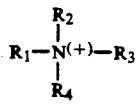

wherein $R_1$, $R_2$, $R_3$ and $R_4$, which may be the same or different, each represent a hydrogen atom, an alkyl or a hydroxyalkyl group containing 1 to 4 carbon atoms. Examples thereof include the ammonium, monomethylammonium, dimethylammonium and trimethylammonium salts of 2-naphthalenesulfonic acid, of 3-diazo-3,4-dihydro-4-oxo-1-naphthalenesulfonic acid or of 6-diazo-5,6-dihydro-5-oxo-1naphthalenesulfonic acid or the like.

Because of the wide range of phenolic resins and photosensitive diazoquinone compounds that are possible, the appropriate amount of acid which is necessary to yield a substantial increase of contrast and selectivity should be determined by means of a few preliminary tests. However, as a rule, an amount of acid of from about 0.01 to about 24% by weight based on the total weight of the photosensitive composition will yield higher contrast and selectivity. A more preferred amount of acid is from 0.05 to 10% by weight and most preferably from 0.2 to 2% by weight based on the total weight of the photosensitive composition. As illustrated in the Examples given hereinafter, high contrast values e.g. superior to 10 associated with excellent selectivity values of the magnitude of 22-23 have been achieved by using an amount of acid of only 0.5% by weight based on the total weight of the photosensitive composition.

The phenolic resins which can be used in the photosensitive compositions of the present invention are the poly(vinylphenols) or the novolaks prepared by the condensation of phenol, a mono-, di- or trialkylphenol (for instance o-cresol, m-cresol, p-cresol, xylenols, p-tert.-butylphenol, etc.), an arylphenol, unsubstituted naphthol, substituted naphthols, resorcinols, alkyl-substituted resorcinols, pyrogallols, alkyl-substituted pyrogallols or mixtures thereof with formaldehyde, acetaldehyde, benzaldehyde or mixtures thereof, or else mixtures of two or more of the aforesaid resins. According to a preferred embodiment, the phenolic resin is a co-condensated novolak obtained by condensation of formaldehyde with a mixture of phenol and p-tert.-butylphenol in which the molar ratio of p-tert-butylphenol to phenol ranges from 1:10 to 10:1.

The photosensitive diazoquinone compounds which can be used in the photosensitive compositions of the present invention are well known to those skilled in the art and may include various compounds having one or more diazoquinone groups such as those described in detail in "Light-Sensitive Systems", by J. KOSAR, John Wiley & Sons, Inc., New York, 1965, Chapter 7.4, p.339-352. Diazoquinone compounds particularly suitable for the present invention include the partial esters of halides of the above-mentioned diazoquinone-sulfonic or -carboxylic acids and phenolic resins such as those described above. As an example, there may be mentioned the partial ester of 6-diazo-5,6-dihydro-5-oxo-1-naphthalenesulfonyl chloride with a phenolic resin. The photosensitive compositions according to the present invention contain an amount of from about 30 to about 95% by weight of phenolic resin and from about 4 to about 60% by weight of diazoquinone compound based on the total weight of the photosensitive composition. Preferably, these photosensitive compositions contain an amount of from 48 to 90% by weight of phenolic resin and from 8 to 45% by weight of diazoquinone compound based on the total weight of the photosensitive composition.

Additives such as colorants, dyes, anti-striation agents, flow modifiers, solvent evaporation rate regulators and adhesion promoters may be added to the photosensitive compositions according to the present invention. These additives can be in general used in an amount ranging from about 20 ppm to about 20% by weight based on the total weight of the photosensitive composition.

The addition of dyes which absorb light at a wavelength of 350 to 500 nm to the photosensitive compositions of the present invention will restrict light exposure to the upper portion of the photoresist layer. Therefore, the addition of these dyes to the photosensitive compositions of the present invention is very favorable, particularly when these compositions are intended to be used in a process such as described in the above-mentioned process of European patent application 184 567, where imaging has to occur only in the upper portion of the photoresist layer (and not through its entire thickness as in wet developed resist system). As further shown in the working Examples given hereinafter, addition of 1 to 20% by weight of a dye absorbing at a wavelength of 350 to 500 nm has a very favorable effect on the linewidth control, particularly on substrates with surface topography. As examples of dyes that can be used in the photosensitive compositions according to the present invention, there may be mentioned azo dyes, such as phenylazoresorcinol (4-(phenylazo)-1,3-benzenediol), 4-(phenylazo)phenol, curcumin and other dyes such as those sold under the trademarks Macrolex 6G (BAYER), Neopen Gelb 075 (BASF), etc. The photosensitive compositions according to the present invention are dissolved in a suitable solvent capable of dissolving all of the abovementioned components, before being coated onto a suitable support to produce a photoresist. Special care has to be taken in the selection of the solvent or solvent mixtures in order to assure complete dissolution of the different resist components and additives, long term storage stability, proper flow and evaporation rate. As examples of solvents which can be used, there may be mentioned, glycol ethers, such as ethylene glycol methyl or ethyl ether, propylene glycol methyl or ethyl ether, the corresponding acetates such as ethylene glycol methyl or ethyl ether acetate, propylene glycol methyl or ethyl ether acetate, ketones, acetic or lactic acid esters of aliphatic alcohols, ethylene or propylene carbonate, bis(alkoxy)dialkyl ethers, cyclic ethers such as dioxane, tetrahydrofuran or its derivatives 1,3-dimethyl-2-imidazolidinone, gamma-butyrolactone, N-methyl-2-pyrrolidone, dimethylformamide, dimethylsulfoxide, and the like. These solvents can be used individually or as mixtures thereof. Usually, an amount of 5 to 75 parts by weight of the photosensitive composition according to the invention is dissolved in 100 parts by weight of solvent. As can be readily understood from the foregoing description, the photosensitive compositions according to the invention are particularly suitable for use as photoresists in a pattern-formation process such as described in European patent application 184 567, or the corresponding U.S. patent application Ser. No. 68,718, filed Jul. 1, 1987 (assigned to the assignee of the present invention). The disclosure of this U.S. patent application is incorporated by reference herein. In this particular application, a layer of the photosensitive composition is coated on a substrate, for example a silicon/silicon dioxide or metalcoated wafer, after such composition is dissolved in a solvent as mentioned above.

Subsequently, the coated wafer is baked (from 50° to 150° C., preferably from 80° to 120° C., for a few seconds up to 60 minutes), the layer is exposed through a mask to ultraviolet radiation at the appropriate wavelengths (i.e., from 100 to 500 nm). The exposed layer is then treated with a silicon compound in the liquid or vapor phase (i.e. any such silylating agent as mentioned above), at a temperature which can vary within a range of from about 10° to about 190° C. for a time of from a few seconds up to 60 minutes. The silicon compound is selectively incorporated into the irradiated portions of the coating and reacts with the functional hydroxyl groups of the phenolic resin in these irradiated portions. The thus treated layer is then developed by dry etching techniques such as oxygen-containing plasma etching, oxygen reactive ion etching, etc.

When used in this process, the photosensitive compositions according to the present invention produce surprisingly high contrast values (e.g. as high as 11) and at the same time high selectivity values (e.g. 22-23). After dry development, excellent quality negative patterns are obtained with steep profiles and excellent linewidth control and no residue is present in the uncovered regions, where the non-irradiated portions have been removed. Furthermore, as already explained above, another advantageous characteristic feature of the composition of the present invention is that these high contrast values and high selectivity values are obtained at lower silylation temperatures in comparison with the prior art compositions based on phenolic resins and diazoquinones.

The following Examples are given for the purpose of illustrating the invention.

EXAMPLE 1

(a) Preparation of the photosensitive resin (novolak+-diazoquinone).

120 g of p-tert.-butylphenol, 300 g of phenol, 78 g of paraformaldehyde, 97 g of a 37% by weight aqueous solution of formaldehyde and 3.8 g of oxalic acid are placed into a 1-liter three necked flask equipped with a condenser and a thermometer. The mixture is heated to reflux at 100° C. during 3 hours. Then, water is removed from the reaction mixture under reduced pressure using a conventional rotary evaporator. The excess phenol is further removed by heating the mixture to 190° C. under reduced pressure. 436 g of a novolak resin are obtained (molar ratio of phenol to p-tert.-butylphenol=80:20). Finally, a photosensitive resin is prepared by esterification of the obtained novolak resin with 6-diazo-5,6-dihydro-5-oxo-1-naphthalenesulfonyl chloride in a weight ratio of 5 to 1.3.

(b) Preparation of 6-diazo-5,6-dihydro-5-oxo-1-naphthalenesulfonic acid.

20 g of the sodium salt of 6-diazo-5,6-dihydro-5-oxo-1-naphthalenesulfonic acid are dissolved in 100 g of demineralized water. This solution is passed over a cationic ion exchange resin and is then concentrated by evaporation. The concentrated product contains less than 100 ppm of sodium, indicating that the conversion of the salt into the free acid is nearly complete.

(c) Influence of the addition of increasing amounts of acid on the properties of the photosensitive compositions.

With the photosensitive resin prepared in 1(a) above, a solution having the following composition is prepared:

30 g of the partial ester of the novolak resin with 6-diazo-5,6-dihydro-5-oxo-1-naphthalenesulfonyl chloride, 70 g of propylene glycol methyl ether acetate.

Five parallel tests are carried out, using each time the solution described above. In test 1, the above solution is used as a control, whereas in tests 2 to 5, solutions are used to which increasing amounts of 6-diazo-5,6-dihydro-5-oxo-1-naphthalenesulfonic acid (prepared as in 1(b) above) are added. The amounts of acid present in each solution tested are as indicated in Table I hereinafter, these amounts being expressed as % by weight of the solid components of the solution. In each of the tests, the solution is spin-coated on several silicon wafers and the coated wafers are baked at 90° C. on a hot plate for 60 seconds. The thickness of the dry resist film is 1.8 $\mu$m. The wafers are then patternwise exposed through a mask using UV light with a wavelength of about 436 nm in an exposure matrix varying from 0 to 300 mJ/cm$^2$. The exposed wafers are then treated with hexamethyldisilazane vapor for 2 minutes at temperatures varying from 120° C. to 160° C. This treatment is carried out in a reaction chamber which, after the introduction of the wafer, is partly evacuated and brought to a stable temperature before hexamethyldisilazane vapor is introduced. Before the wafer is removed from the reaction chamber, this is partly evacuated again and purged with nitrogen. Finally, the wafers thus treated are etched in an anisotropic oxygen plasma, applying a 30% overetch.

For each solution tested, a contrast curve is set up by plotting residual film thickness after development versus the logarithm of the UV exposure dose and the contrast is determined from the slope of the linear portion of the contrast curve. Similarly, for each solution tested, the selectivity is determined from the initial film thickness and the residual film thickness measured after development of the exposed resist. Contrast and selectivity values obtained for each solution tested are shown in Table I. For each solution, the silylation temperature at which these values are obtained, is also indicated

TABLE I

| Test | Amount of acid (% by weight) | Silylation temperature (°C.) | Contrast | Selectivity |
|---|---|---|---|---|
| 1 | 0 | 160 | 2.9 | 15 |
| 2 | 0.1 | 145 | 4.2 | 18 |
| 3 | 0.25 | 135 | 7.5 | 22 |
| 4 | 0.5 | 130 | 10.5 | 23 |
| 5 | 1 | 120 | 11 | 22 |

The results show that the addition of small amounts of 6-diazo5,6-dihydro-5-oxo-1-naphthalenesulfonic acid dramatically improves the contrast of the resist composition. Thus, whereas in the absence of acid, the contrast is only 2.9 (test 1), the contrast is 10.5 when the composition contains 0.5% by weight of acid (test 4) and as high as 11 when the composition contains 1% by weight of acid (test 5). Table I further shows that there is at the same time a small but significant improvement in selectivity from a value of 15 (test 1) to 22-23 (tests 3 to 5). The results show also that although high contrast and selectivity values are obtained when small amounts of acid are added, the required silylation temperature is lower (120°-130° C.) than for compositions to which no acid has been added (160° C.).

EXAMPLE 2

30 g of the photosensitive resin prepared in Example 1(a) are dissolved in 70 g of propylene glycol methyl ether acetate and 2-naphthalenesulfonic acid is added to this solution in an amount of 1% by weight of the solid components of the solution. This solution is spin-coated on silicon wafers and the coated wafers are baked at 90° C. on a hot plate for 60 seconds. The thickness of the dry resist film is 1.8 $\mu$m. The wafers are then patternwise exposed through a mask to UV light at a wavelength of 365 nm. The exposed wafers are then treated with hexamethyldisilazane vapor, at temperatures varying from 120° C. to 160° C. in the same way as in Example 1. Finally, the wafers thus treated are etched in an anisotropic oxygen plasma, applying a 30% overetch.

A pattern consisting of 0.5 $\mu$m equal lines and spaces is obtained, with clean spaces, free of residue, at a silylation temperature of 130° C. When comparing these results with those of comparative test 1 (see example 1(c)), where no acid is present in the photosensitive composition, it can be seen that the addition of 1% by weight of 2-naphthalenesulfonic acid makes possible a decrease of the silylation temperature of 30° C. (130° C. instead of 160° C.).

EXAMPLE 3

30 g of the photosensitive resin prepared in Example 1(a) are dissolved in 70 g of 1,3-dimethyl-2-imidazolidinone. This solution is divided in three equal parts, which are treated as follows:
the first part is used as such;
to the second part, 6-diazo-5,6-dihydro-3-oxo1-naphthalenesulfonic acid (prepared as in Example 1(b)) is added in an amount of 1% by weight of the solid components of the solution;
to the third part, 6-diazo-5,6-dihydro-3-oxo-1-naphthalenesulfonyl chloride is added in an amount of 1% by weight of the solid components of the solution.

The three solutions thus obtained are then spin-coated on silicon wafers and the coated wafers are baked at 90° C. on a hot plate for 60 seconds. The thickness of the dry resist film is 2 $\mu$m. The wafers are then patternwise exposed through a mask to UV light at a wavelength of about 365 nm. The exposed wafers are then treated with hexamethyldisilazane vapor, at a temperature of 130° C. for 2 minutes. Finally, the wafers are etched in an anisotropic oxygen plasma, applying a 30% overetch.

After plasma development, the first solution containing neither acid nor acid chloride, produces no images. During plasma development, the resist has been completely stripped from the substrate. On the other hand, the second and third solutions give well-defined patterns. It can be concluded that no appreciable silylation takes place at 130° C. when the first solution is used, which contains no acid additives. As already shown in Example 1(c), a silylation temperature of 160° C. must be used in order to obtain patterns with such a solution.

On the other hand, as is shown above, good patterns are obtained by the addition of 1% by weight of 6-diazo-5,6-dihydro-5-oxo-1-naphthalenesulfonic acid or its chloride, even at a silylation temperature of 130° C.

EXAMPLE 4

A solution is prepared as described in Example 1(c) and to this solution 6-diazo-5,6-dihydro-5-oxo-1-naphthalenesulfonic acid is added in an amount of 0.5% by weight of the solid components of the solution. This solution is spin-coated on silicon wafers with an aluminum layer having steps of 1 $\mu$m high. The thus coated wafers are baked at 90° C. on a hot plate for 60 seconds.

The thickness of the dry resist film is 2 μm. The wafers are then patternwise exposed through a mask to UV light at a wavelength of about 436 =and at an exposure dose of 150 mJ/cm². The exposed wafers are then treated with hexamethyldisilazane vapor at a temperature of 130° C. for 2 minutes. Finally, the wafers are etched in an anisotropic oxygen plasma. The linewidth of the nominal 1 μm patterns is measured on the steps and in between the steps, in such a way that maximum and minimum linewidths are recorded. The difference between the maximum and minimum linewidths is the linewidth change ($\Delta_{CD}$) caused by the step in the substrate. A value for $\Delta_{CD}$ of 0.3 μm is obtained with the above solution.

The same experiment is repeated following exactly the same procedures, but small amounts of different dyes are added to the coating solution. The nature and the amount of dye present in each solution tested are as indicated in Table II hereinafter, the amounts being expressed as % by weight of the solution.

This Table II shows the effect of the different dyes on the linewidth change ($\Delta_{CD}$ in μm) and on the values of the sidewall angles of the resulting patterns.

TABLE II

| Dye | Amount of dye (% by weight) | $\Delta_{CD}$ (μm) | Sidewall angle (°) |
|---|---|---|---|
| — | 0 | 0.3 | 86 |
| 4-(phenylazo)-1,3-benzenediol | 0.4 | 0.22 | 84 |
| Curcumin | 0.5 | 0.15 | 87 |
| Curcumin | 1.5 | 0.03 | 86 |
| Macrolex 6G[2] | 2 | 0.11 | 84 |
| Neopen Gelb[2] | 2 | 0.04 | 85 |
| Neopen Gelb 075[2] | 6 | 0.03 | 87 |

[1]Trademark of BAYER A.G.
[2]Trademark of BASF A.G.

Since only a thin top layer has to be exposed, the higher absorption due to the addition of the dyes will not influence the photosensitivity and the resist slopes, this in contrast with normal, wet developed photoresists, where exposure down to the bottom of the resist layer is essential for complete development As is apparent from Table II, the addition of dyes to the photosensitive compositions of the present invention has a very favorable effect; it enables an outstanding control of the linewidth on substrates with surface topography without any adverse effect on the resist profiles (sidewall angles remain constant).

EXAMPLE 5

The photosensitive resin used is prepared by esterification of poly(vinylphenol), commercially available from MARUZEN C, JAPAN, with 3-diazo-3,4-dihydro-4-oxo-1-naphthalenesulfonyl chloride in a weight ratio of 5 to 1.5. 30 g of this resin and 0.3 g of 3-diazo-3,4-dihydro 4-oxo-1-naphthalenesulfonic acid are dissolved in 70 g of propylene glycol methyl ether acetate. This solution is spin-coated on several silicon wafers and the coated wafers are baked at 90° C. on a hot plate for 60 seconds (film thickness: 1.7 μm). The wafers are then patternwise exposed through a mask to UV light at a wavelength of 248 nm in an exposure matrix varying from 0 to 300 mJ/cm². The exposed wafers are then treated with hexamethyldisilazane vapor at temperatures between 120° and 160° C. Subsequently, the wafers are etched in an anisotropic oxygen plasma applying a 30% overetch. High resolution patterns are obtained with smooth surfaces and vertical sidewalls at an exposure dose of 120 mJ/cm² and a silylation temperature of 150° C.

EXAMPLE 6

30 g of the photosensitive resin prepared in example 1(a) are dissolved in 70 g of ethyl lactate. To this solution each of the acids listed in Table III are added in an amount of 5% by weight of the solid components of the solution.

The solutions thus obtained are spin-coated on silicon wafers and the coated wafers are baked at 90° C. on a hot plate for 60 seconds. The thickness of the dry resist film is each time 1.7 μm. The wafers are then patternwise exposed through a mask to UV light at a wavelength of 365 nm. The exposed wafers are then treated with hexamethyldisilazane vapor, at temperatures varying from 120° C. to 160° C. in the same way as in example 1. Finally, the wafers thus treated are etched in an anisotropic oxygen plasma, applying a 30% overetch.

Table III gives for every solution the silylation temperature required to obtain 0.5 μm equal line and space patterns.

TABLE III

| Acid | Silylation temp. (°C.) |
|---|---|
| Picric acid (comparative) | 160° C. |
| Nicotinic acid (comparative) | 160° C. |
| 2,4-dihydroxybenzoic acid (comparative) | 160° C. |
| 4-amino-1-naphthalenesulfonic acid (comparative) | 160° C. |
| 1-naphthalenesulfonic acid | 145° C. |
| 2-naphthalenesulfonic acid | 130° C. |
| 6-diazo-5,6-dihydro-5-oxo-1-naphthalenesulfonic acid | 130° C. |
| 3-diazo-3,4-dihydro-4-oxo-1-naphthalenesulfonic acid | 130° C. |

These results show very clearly that the nature of the acid is important in obtaining a decrease of the silylation temperature. Thus, with the solutions containing aromatic or heterocyclic acids, such as picric acid and nicotinic acid (as disclosed in U.S. Pat. No. 4,009,033) a silylation temperature of 160° C. must be used in order to obtain patterns. The same is true for aromatic amino acids, such as 4-amino-1-naphthalenesulfonic acid. On the other hand, better patterns are obtained by the addition of 5% by weight of 1-naphthalenesulfonic acid, 2-naphthalenesulfonic acid, 6-diazo-5,6-dihydro-5-oxo-1-naphthalenesulfonic acid and 3-diazo-3,4-dihydro-4-oxo-1-naphthalenesulfonic acid even at a silylation temperature of 130° C.

EXAMPLE 7

30 g of the photosensitive resin prepared in example 1(a) are dissolved in 70 g of 1,3-dimethyl-2-imidazolidinone. To this solution is added the ammonium salt of 6-diazo-5,6-dihydro-5-oxo-1-naphthalenesulfonic acid in an amount of 0.5% by weight of the solid components of the solution.

The solution thus obtained is spin-coated on silicon wafers and the coated wafers are baked at 90° C. on a hot plate for 60 seconds. The thickness of the dry resist film is 1.9 μm. The wafers are then patternwise exposed through a mask to UV light at a wavelength of 365 nm. The exposed wafers are then treated with hexamethyldisilazane vapor, at temperatures varying from 120° C. to 160° C. in the same way as in example 1. Finally, the wafers thus treated are etched in an anisotropic oxygen plasma, applying a 30% overetch.

High resolution patterns with equal lines and spaces are obtained, with clean spaces, free of residue, at a silylation temperature of 140° C.

EXAMPLE 8

30 g of the photosensitive resin prepared in example 1(a) are dissolved in 70 g of N-methyl-pyrrolidone. To this solution is added the trimethylammonium salt of 3-diazo-3,4-dihydro-4-oxo-1-naphthalenesulfonic acid in an amount of 1% by weight of the solid components of the solution.

The solution thus obtained is spin-coated on silicon wafers and the coated wafers are baked at 90° C. on a hot plate for 60 seconds. The thickness of the dry resist film is 1.9 μm. The wafers are then patternwise exposed through a mask to UV light at a wavelength of 365 nm. The exposed wafers are then treated with hexamethyldisilazane vapor, at temperatures varying from 120° C. to 160° C. in the same way as in example 1. Finally, the wafers thus treated are etched in an anisotropic oxygen plasma, applying a 30% overetch. High resolution patterns with equal lines and spaces are obtained, with clean spaces, free of residue, at a silylation temperature of 130° C.

EXAMPLE 9

30 g of the photosensitive resin prepared in example 1(a) are dissolved in 70 g of 1,3-dimethyl-2-imidazolidinone. To this solution is added the ammonium salt of 2-naphthalenesulfonic acid in an amount of 2% by weight of the solid components of the solution.

The solution thus obtained is spin-coated on silicon wafers and the coated wafers are baked at 90° C. on a hot plate for 60 seconds. The thickness of the dry resist film is 1.9 μm. The wafers are then patternwise exposed through a mask to UV light at a wavelength of 365 nm. The exposed wafers are then treated with hexamethyldisilazane vapor, at temperatures varying from 120° C. to 160° C. in the same way as in example 1. Finally, the wafers thus treated are etched in an anisotropic oxygen plasma, applying a 30% overetch. High resolution patterns with equal lines and spaces are obtained, with clean spaces, free of residue, at a silylation temperature of 130° C.

EXAMPLE 10

30 g of the photosensitive resin prepared in example 1(a) are dissolved in 70 g of N-methyl-pyrrolidone. To this solution is added the dimethylammonium salt of 2-naphthalenesulfonic acid in an amount of 2% by weight of the solid components of the solution.

The solution thus obtained is spin-coated on silicon wafers and the coated wafers are baked at 90° C. on a hot plate for 60 seconds. The thickness of the dry resist film is 1.9 μm. The wafers are then patternwise exposed through a mask to UV light at a wavelength of 365 nm. The exposed wafers are then treated with hexamethyldisilazane vapor, at a temperature varying from 120° C. to 160° C. in the same way as in example 1. Finally, the wafers thus treated are etched in an anisotropic oxygen plasma, applying a 30% overetch.

High resolution patterns with equal lines and spaces are obtained, with clean spaces, free of residue, at a silylation temperature of 140° C.

We claim:

1. A process of forming a negative pattern on a substrate which comprises (a) coating said substrate with, as photoresist, a layer of a photosensitive composition which consists essentially of, in admixture, at least one partial ester of a phenolic resin with a diazoquinonesulfonic acid or a diazoquinonecarboxylic acid and an amount sufficient to increase the contrast and the selectivity of the photoresist of at least one aromatic fused polycyclic sulfonic acid in the form of the free acid and/or an ammonium salt, the cationic component of the ammonium salt having the formula

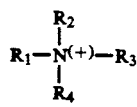

wherein $R_1$, $R_2$, $R_3$, and $R_4$, which may be the same or different, each represents a hydrogen atom, an alkyl or a hydroxyalkyl group containing 1 to 4 carbon atoms, with the proviso that said aromatic sulfonic acid is other than an aromatic amino acid;

(b) exposing said layer to ultraviolet radiation through a mask to expose only selected portions of the layer;

(c) treating the exposed layer with a silicon compound, whereby said silicon compound is selectively absorbed into the irradiated portions of the layer; and (d) developing the thus treated layer using dry etching techniques to remove selectively the nonirradiated portions of the layer to obtain a negative pattern.

2. A process according to claim 1, wherein in the said partial ester the said phenolic resin is present in an amount of from about 30 to about 95% by weight and said diazoquinonesulfonic acid or diazoquinonecarboxylic acid is present in an amount of from about 4 to about 60% by weight based on the total weight of the photosensitive composition.

3. A process according to claim 1, wherein in the said partial ester the said phenolic resin is present in an amount of from about 48 to about 90% by weight and said diazoquinonesulfonic acid or diazoquinonecarboxylic acid is present in an amount of from about 8 to about 45% by weight based on the total weight of the photosensitive composition.

4. A process according to claim 1, wherein said aromatic fused polycyclic acid is selected from the group consisting of 1-naphthalenesulfonic acid,
2-naphthalenesulfonic acid,
3-diazo-3,4-dihydro-4-oxo-1-naphthalenesulfonic acid,
6-diazo-5,6-dihydro-5-oxo-1-naphthalenesulfonic acid,
6-diazo-5,6-dihydro-5-oxo-2-naphthalenesulfonic acid,
4-diazo-3,4-dihydro-3-oxo-1-naphthalenesulfonic acid,
5-diazo-5,6-dihydro-6-oxo-1-naphthalenesulfonic acid,
5-diazo-5,6-dihydro-6-oxo-2-naphthalenesulfonic acid, and mixtures of at least two of the aforesaid compounds.

5. A process according to claim 2, wherein said aromatic fused polycyclic acid is a diazoquinone-sulfonic acid having the formula

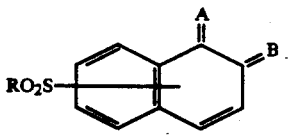

wherein A represents $N_2$ or O and B is O when A is $N_2$ or B is $N_2$ when A is O and R represents OH, or OM, where M is an ammonium or a substituted ammonium ion.

6. A process according to claim 1, wherein said aromatic fused polycyclic acid is incorporated in said photosensitive composition in an amount of from 0.01 to about 24% by weight based on the total weight of the composition.

7. A process according to claim 1, wherein said aromatic fused polycyclic acid is incorporated in said photosensitive composition in an amount of from 0.05 to 10% by weight based on the total weight of the composition.

8. A process according to claim 1, wherein said aromatic fused polycyclic acid is incorporated in said photosensitive composition in an amount of from 0.2 to 2% by weight based on the total weight of the composition.

9. A process according to claim 1, wherein said aromatic fused polycyclic acid is present as an ammonium salt, the cation component of which is selected from those having the formula

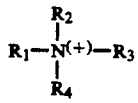

wherein $R_1$, $R_2$, $R_3$ and $R_4$, which may be the same or different, each represent a hydrogen atom, an alkyl or a hydroxyalkyl group containing 1 to 4 carbon atoms.

10. A process according to claim 1, wherein said aromatic fused polycyclic acid is present in the form of the free acid.

11. A process according to claim 1, wherein said phenolic resin is a poly(vinylphenol) or a novolak obtained by condensation of phenol, a mono-, di- or trialkylphenol, an arylphenol, an unsubstituted naphthol, a substituted naphthol, a resorcinol, an alkyl-substituted resorcinol, a pyrogallol, an alkyl-substituted pyrogallol or mixtures thereof, with formaldehyde, acetaldehyde, benzaldehyde or a mixture thereof, or mixtures of two or more of the said resins.

12. A process according to claim 1, wherein said phenolic resin is a cocondensated novolak obtained by condensation of formaldehyde with a mixture of phenol and p-tert.-butylphenol in which the molar ratio of p-tert.-butylphenol to phenol is from 1:10 to 10:1.

13. A process according to claim 1, wherein a dye absorbing light at a wavelength of 350 to 500 nm is added to the photosensitive composition.

14. A process according to claim 1, wherein the photosensitive composition is dissolved in a solvent or a solvent mixture.

15. A negatively imaged article for use in producing an integrated circuit made by means of the process according to claim 1.

* * * * *